United States Patent
Yun

[19]

[11] Patent Number: 6,023,569

[45] Date of Patent: Feb. 8, 2000

[54] METHOD AND DEVICE FOR PRODUCING AUTOMATIC INSERTION PATH IN APPARATUS FOR AUTOMATICALLY INSERTING ELECTRONIC COMPONENTS INTO PRINTED CIRCUIT BOARD

[75] Inventor: Chae-Won Yun, Kyeongbuk, Rep. of Korea

[73] Assignee: Daewoo Electronics Co., Ltd., Seoul, Rep. of Korea

[21] Appl. No.: 08/885,810

[22] Filed: Jun. 30, 1997

[30] Foreign Application Priority Data

Jun. 29, 1996 [KR] Rep. of Korea ............... 96-25484

[51] Int. Cl.$^7$ .................................................. G06F 17/50
[52] U.S. Cl. ......................... 395/500.16; 364/468.28
[58] Field of Search .................. 395/500.02, 500.16; 364/468.28, 468.01, 488, 489, 490, 491

[56] References Cited

U.S. PATENT DOCUMENTS

| | | | |
|---|---|---|---|
| 4,212,075 | 7/1980 | Cleversey et al. | 364/580 |
| 4,464,833 | 8/1984 | Duncan | 29/718 |
| 4,566,071 | 1/1986 | Takahashi | 364/468 |
| 4,706,187 | 11/1987 | Arai et al. | 364/191 |
| 4,805,110 | 2/1989 | Takahashi et al. | 364/468 |
| 4,978,224 | 12/1990 | Kishimoto et al. | 356/394 |
| 5,079,834 | 1/1992 | Itagaki et al. | 29/840 |
| 5,224,325 | 7/1993 | Takahashi et al. | 53/443 |
| 5,618,744 | 4/1997 | Suzuki et al. | 438/599 |
| 5,841,659 | 11/1998 | Tanaka et al. | 364/468 |

FOREIGN PATENT DOCUMENTS

2308682A  7/1997  United Kingdom.

*Primary Examiner*—Kevin J. Teska
*Assistant Examiner*—Leigh Marie Garbowski
*Attorney, Agent, or Firm*—Jacobson, Price, Holman & Stern, PLLC

[57] ABSTRACT

An automatic insertion method automatically produces an automatic insertion path in an apparatus for automatically inserting electronic components into a printed circuit board. In the automatic insertion method, data for producing an automatic inserting path are stored. It is decided whether an automatic input mode with respect to first and last components is selected. An adjacent distance matrix is produced. The first and last components is automatically detected. The automatic inserting path is produced based on the stored data for producing the automatic insertion path. In accordance with the automatic insertion method, an automatic insertion path of an automatic insertion apparatus is automatically produced so that a starting and ending point of each equipment is selected by a worker or selected automatically.

8 Claims, 5 Drawing Sheets

METHOD AND DEVICE FOR PRODUCING AUTOMATIC INSERTION PATH IN APPARATUS FOR AUTOMATICALLY INSERTING ELECTRONIC COMPONENTS INTO PRINTED CIRCUIT BOARD

BACKGROUND OF THE INVENTION

1. Field of the Invention

The present invention relates to an apparatus for automatically inserting electronic components into a printed circuit board (PCB). More particularly, the present invention relates to a method for automatically producing an automatic insertion path in an apparatus for automatically inserting electronic components into a PCB and a device for performing the same.

2. Prior Art

In an automatic inserting apparatus for automatically inserting electronic components to a PCB, working preparation hours and guide tables should be produced so as to increase efficiency of automatic inserting equipment. In order to effectively use the automatic insertion apparatus, a worker produces an automatic insertion path in advance so that the automatic inserting apparatus can insert the electronic component into the corresponding location of the PCB along the automatic insertion path. However, since a model automatically inserted into the PCB is variable, whenever the PCB model changes, the worker newly produces an automatic inserting path.

When automatically inserting the electronic components into the PCB, various equipment need according to kinds of electronic components. Also, an automatic insertion path and order are adjusted to characteristics of each of the automatic insertion equipment and electronic components. In order to use the automatic insertion apparatus, after workers determine an automatic insertion path in advance in the field, they produce numerical control programs and working guide tables. The above-mentioned operation needs an expert with much experience and knowledge with respect to the equipment. Much time is required even for workers who have been working for a long time in the field, and the workers find it hard to perform the operation in everything by hand. Furthermore, because the paths and working guide tables which are determined in that manner cannot improve a machinery operation ratio, a development of a software which produces rational operation strategy by means of a computer has been necessitated.

U.S. Pat. 4,978,224 (issued to Shin Kishimoto et al. on Dec. 18, 1990) discloses a method and apparatus for automatically inspecting whether chip components mounted on a printed circuit board have been set correctly or not. To determine whether chip components are properly mounted on a printed circuit board, two sets of slit light beams for projecting slit line images in mutually perpendicular directions are alternately made incident thereon diagonally from above. Edges of the mounted chip components produce discontinuities in the projected slit beam image patterns such that the positions, sizes, orientations, etc. of individual mounted components can be calculated from image data obtained from viewing positions above the circuit board by a camera or the like. Since it can be easily ascertained how the slit line image pattern should appear if proper components are properly mounted, an analysis of the calculated data can indicate whether the chip components are properly mounted on the tested printed circuit board. However, the patent of Shin Kishimoto et al. does not disclose the method for automatically producing an automatic inserting path and a device for performing the same.

In accordance with the present invention, an automatic insertion path of an automatic insertion apparatus is automatically produced so that a starting and ending point of each equipment is selected by a worker or selected automatically.

SUMMARY OF THE INVENTION

In view of the foregoing, it is an object of the present invention to provide a method for automatically producing an automatic inserting path in an apparatus for automatically inserting electronic components into a printed circuit board.

To achieve the object, the present invention provides a method for producing an automatic inserting path in an automatic inserting apparatus comprising the steps of:

(i) storing automatic inserting path data and a limit distance between two electronic components to be inserted into the printed circuit board, wherein the automatic inserting path data includes computer aided design data of the printed circuit board and component data, the computer aided design data includes component number data of all electronic components to be inserted into the printed circuit board, x and y coordinates of the printed circuit board, and the component data includes component number data of all the electronic components corresponding to the component number data of the computer aided design data, codes of all the electronic components, and component name standards;

(ii) displaying the printed circuit board in which all the electronic components are inserted on a screen;

(iii) selecting the first and last components from all the electronic components of the printed circuit board displayed in step (ii), wherein the first component represents a starting component of the automatic inserting path, and the last component represents an ending component thereof;

(iv) producing an adjacent distance matrix (ADM) (i, j), the ADM(i,j) being a matrix that forms distances between i and j components to be inserted into the printed circuit board in a form of a matrix where i and j represent optional row and column component indices, respectively, wherein step (iv) includes (iv-1) setting count values of optional row and column component indices to zero, (iv-2) adding one to the count value of the optional row component index, (iv-3) judging whether the count value of the optional row component index is smaller than or equal to a total number of the electronic components to be inserted into the printed circuit board, (iv-4) adding one to the count value of the optional column component index when the count value of the optional row component index is smaller than or equal to the total number of the electronic components to be inserted into the printed circuit board, (iv-5) judging whether the count value of the optional column component index is smaller than or equal to the total number of the electronic components to be inserted into the printed circuit board, (iv-6) comparing a distance between i and j components with the limit distance stored in step (i) when the count value of the optional column component index is smaller than or equal to the total number of the electronic components in order to decide whether the ADM(i,j) is set as distance between i and j components, (iv-7) firstly deciding whether an i-j path is a reverse path and controlling addition of a reverse path penalty to the ADM(i,j) according to the first decision, (iv-8) secondly deciding whether an inserting head number of the j component is equal to an inserting head number of the i component and controlling addition of a head order penalty to the ADM(i,j) according to the second decision, (iv-9) thirdly deciding whether a distribution area of the j component is equal to a distribution area of the i component and controlling addition of a distribution penalty to the ADM(i,j) according to the third decision, and (iv-10) fourthly deciding whether the ADM(i,j) with respect to all i and j components is calculated and controlling whether the calculation of the ADM(i,j) is stopped according to the fourth decision; and (v) producing an automatic inserting path based on the the ADM(i, j) obtained in step (iv), wherein step (v) includes (v-1) reading indices of the first and last components selected in step (iii) from the ADM(i,j) obtained in step S306, (v-2) setting an optinal row component index as the first component index, (v-3) setting a reference distance, an optional column index, and a next inserting component to a predetermined number, one, and −1, respectively, (v-4) judging whether the optional column index is different from the last component index, a component index that is already selected in the automatic path, and the optional row index, (v-5) setting a distance between two selected components as the ADM(i,j) when the optional column index "j" is different from the last component index, the already selected index in the automatic path, and the optional row index, (v-6) judging whether the reference distance set in step (v-3) is greater than the distance between two selected components, (v-7) setting the set reference distance as the distance between two selected components and setting a component corresponding to the optional column component index as a next inserting component when the set reference distance is equal to or greater than the distance between two selected components, (v-8) judging whether the optional column component index is smaller than or equal to the total number of components to be inserted into the printed circuit board, (v-9) adding one to the count value of the optional column component index and executing step (v-4) when the count value of the optional column component index is smaller than the total number of components, and connecting the next inserting component next to the first component corresponding the first component index set in step (v-2) in the automatic inserting path when count value of the optional column component index is equal to or greater than the total number of components, (v-10) judging whether all paths of the automatic inserting path are constituted, (v-11) finishing a total operation when all the paths of the automatic inserting path are constituted, and setting an index of the next inserting component as the optional row index and executing step (v-3) when at least one path of the automatic inserting path is unconnected.

In accordance with the present invention, an automatic inserting path of an automatic insertion apparatus is automatically produced so that a starting and ending point of each equipment is selected by a worker or selected automatically.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE PREFERRED EMBODIMENTS

Hereinafter, an embodiment of the present invention will be described in detail with reference to the accompanying drawings.

Figure 1:
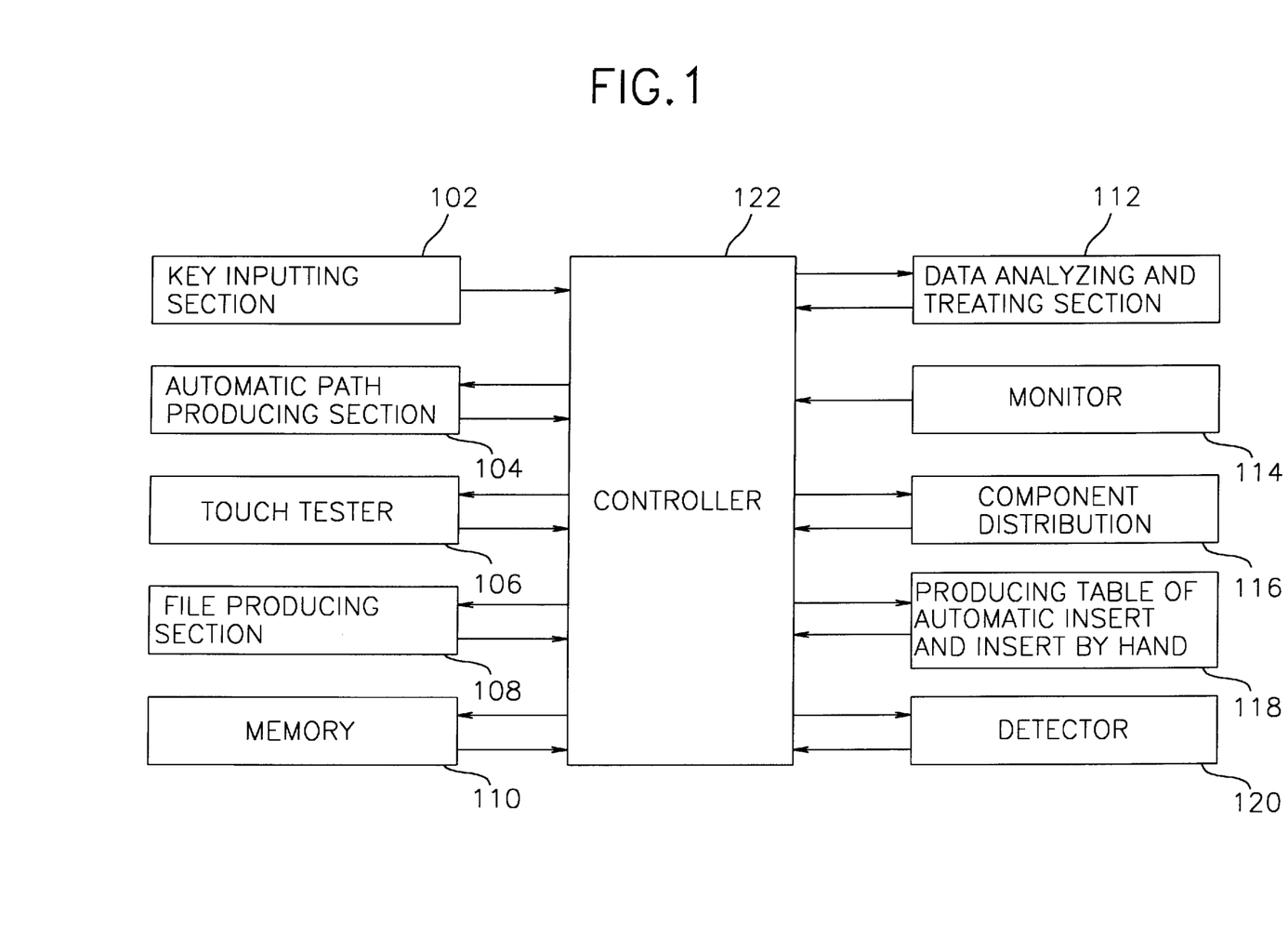
FIG. 1 is a block diagram for showing a configuration of an apparatus for automatically producing an automatic inserting path according to an embodiment of the present invention.

FIG. 1 shows a configuration of a device 10 for automatically producing an automatic insertion path in the automatic inserting apparatus according to an embodiment of the present invention. The device 10 includes a key inputting section 102, a memory 110, an automatic insertion path producing section 104, a touch tester 106, a file producing section 108, a data analyzing and treating section 112, a monitor 114, a component distribution section 116, a producing table 118 by automatic insertion and by insertion by hand, a detector 120, and a controller 122.

The key inputting section 102 provides a button pad so that a worker can input the data for producing an automatic insertion path. The key inputting section 102 generates commands with component date and CAD data to provide into a controller 122. The memory 110 stores automatic inserting path data and a limit distance between two electronic components to be inserted into the printed circuit.

The automatic insertion path producing section 104 reads out the data for producing the automatic inserting path from the memory 110 and produces an automatic path with respect to the components allotted to automatic equipment and amends the automatic path by amendment data which are inputted from the key inputting section 102. The touch tester 106 tests a touch state between the components and between the component and a head of equipment when inserting the electronic component into the PCB, and searches a component which has a great possibility of being touched to display through a monitor 114.

The file producing section 108 produces a file to be used in a test equipment such as ITC equipment for testing a printed circuit board which is automatically inserted into the PCB, and produces an inserting order, a coordinate, and a direction of the components.

The data analyzing and treating section 112 receives CAD data and component data from the key inputting section 102 to produce a data base. The monitor 114 receives display data from the controller 122 and displays the data thereon. The component distribution section 116 distributes component by various equipment between equipment taking into consideration a balance between an axial equipment and a special axial equipment and between a radial equipment and a special radial equipment and indicates the color by various equipment. The producing table 118 of an automatic insert and an insert by hand produces a guidance table of an automatic inserting operation and an insertion operation by hand.

The detector 120 automatically detects the first and last components. The controller 122 decides whether an automatic input mode with respect to the first and last components is selected, produces an adjacent distance matrix (ADM), and controls operations of the memory 110, the detector 120, and the automatic insertion path producing section 104, the touch tester 106, the file producing section 108, the data analyzing and treating section 112, the monitor 114, the component distribution section 116, the producing table 118 by automatic insertion and by insertion by hand, the detector 120, and the controller 122.

Figure 2:
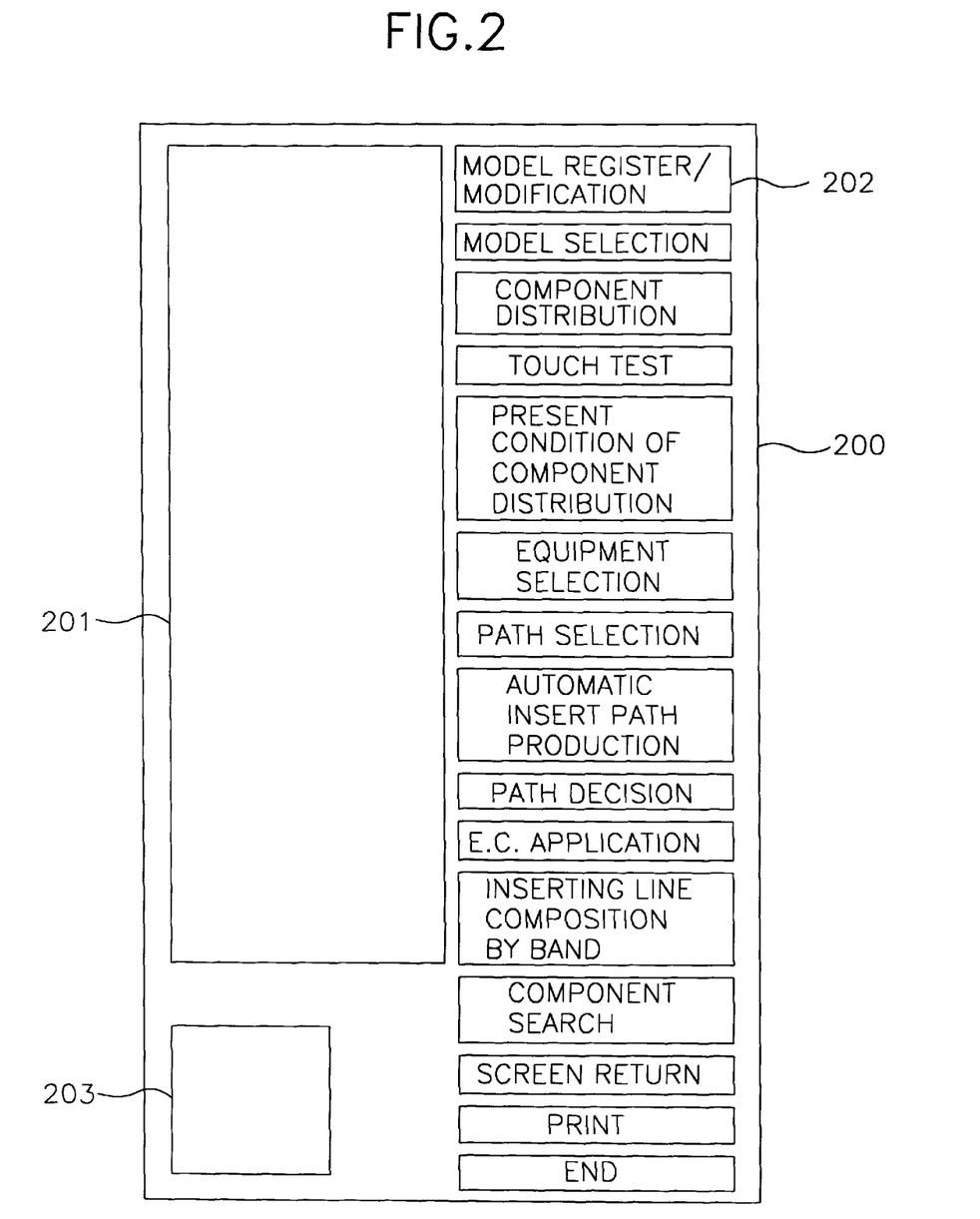
FIG. 2 is a view for showing an example of a main menu screen indicated in the monitor of FIG. 1.

FIG. 2 shows an example of a main menu screen indicated in the monitor of FIG. 1. A component layout 201 which is produced by the CAD data is indicated at the upper left portion of the main menu screen. A pattern 202 which connects each of the components is indicated at the lower left portion of the component layout 201. A menu 203 for selecting a function is described at the right portion of the component layout 201 and the pattern 202. The menu 203 includes a model register and modification, a model selection, a component distribution, a touch test, a present condition of a component distribution, equipment selection, a path selection, an automatic insertion path production, a path decision, E.C. application, an inserting line composition by hand, a component search, a screen return, a print, and an end.

Figure 3:
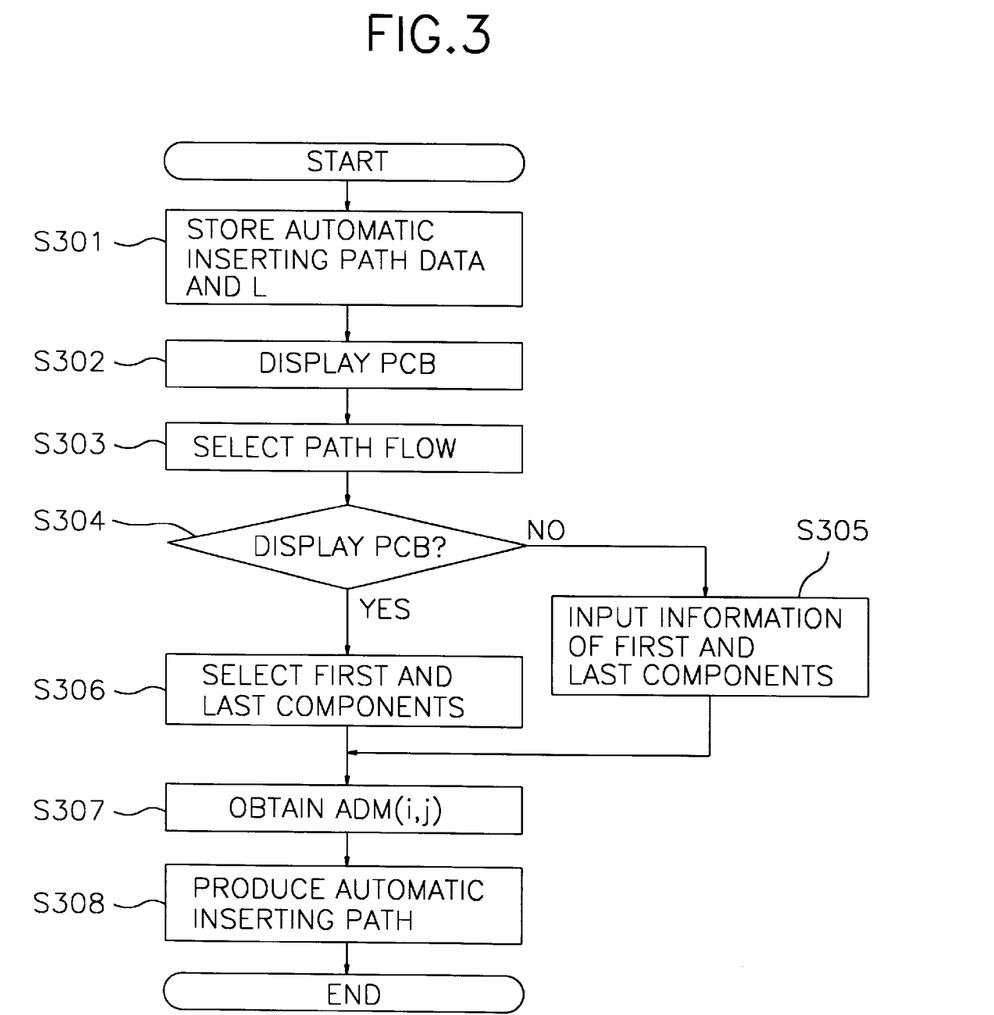
FIG. 3 is a flow chart for illustrating an operation of the method for automatically producing an automatic inserting path according to an embodiment of the present invention.

A description of the operation of the apparatus and method for producing an automatic inserting path in an automatic inserting apparatus according to the embodiment of the present 5 invention is as follows. FIG. 3 illustrates an operation of the method for automatically producing an automatic inserting path according to an embodiment of the present invention.

Before performing an operation for producing an automatic inserting path, the controller 122 controls the memory 110 to store automatic inserting path data and a limit distance L between two electronic components to be inserted into the printed circuit therein(step S301). Preferably, in an embodiment of the present invention, the automatic inserting path data includes computer aided design (CAD) data of a printed circuit board and component data. The CAD data includes component number data of all electronic components to be inserted into the printed circuit board, and x and y coordinates of the printed circuit board. All the electronic components includes first and last components to be inserted in the printed circuit board. The first component represents a starting component of the automatic inserting path, and the last component represents an ending component thereof. The component data includes component number data of all the electronic components corresponding to the component number data of the CAD data. The component data includes codes of all the electronic component and component name standards.

In step S302, the controller 122 controls a monitor 114 to display a printed circuit board on a screen.

In step S303, a user selects a flow of the automatic inserting path of the printed circuit board displayed on the monitor 114 by using the key inputting section 102. For example, when the printed circuit board is divided into four distribution areas having upper left, upper right, lower left, and lower right areas, the user can select the automatic inserting path flow in the order of the lower left, lower right, upper right, and upper left areas.

In step S304, the controller 122 decides whether or not an automatic inputting mode with respect to first and last components is selected by an operation of the key inputting section 102 of the user.

According to the result of the decision in step S304, when the automatic inputting mode is not selected, the controller 122 decides that a mode by hand with respect to first and last components is selected and a user inputs information with respect to first and last components by using the key inputting section and selects the first and last components (step S305). When it is decided that the automatic input mode is selected in step S304, the user selects optional components from the printed circuit board displayed on the monitor 114 as the first and last components (step S306).

In step S307, the controller 122 produces an adjacent distance matrix (ADM)(i,j). The ADM(i,j) represents a matrix that forms distances between i and j components to be inserted into the printed circuit board in a form of a matrix where i and j represent optional row and column component indices, respectively.

Figure 4:
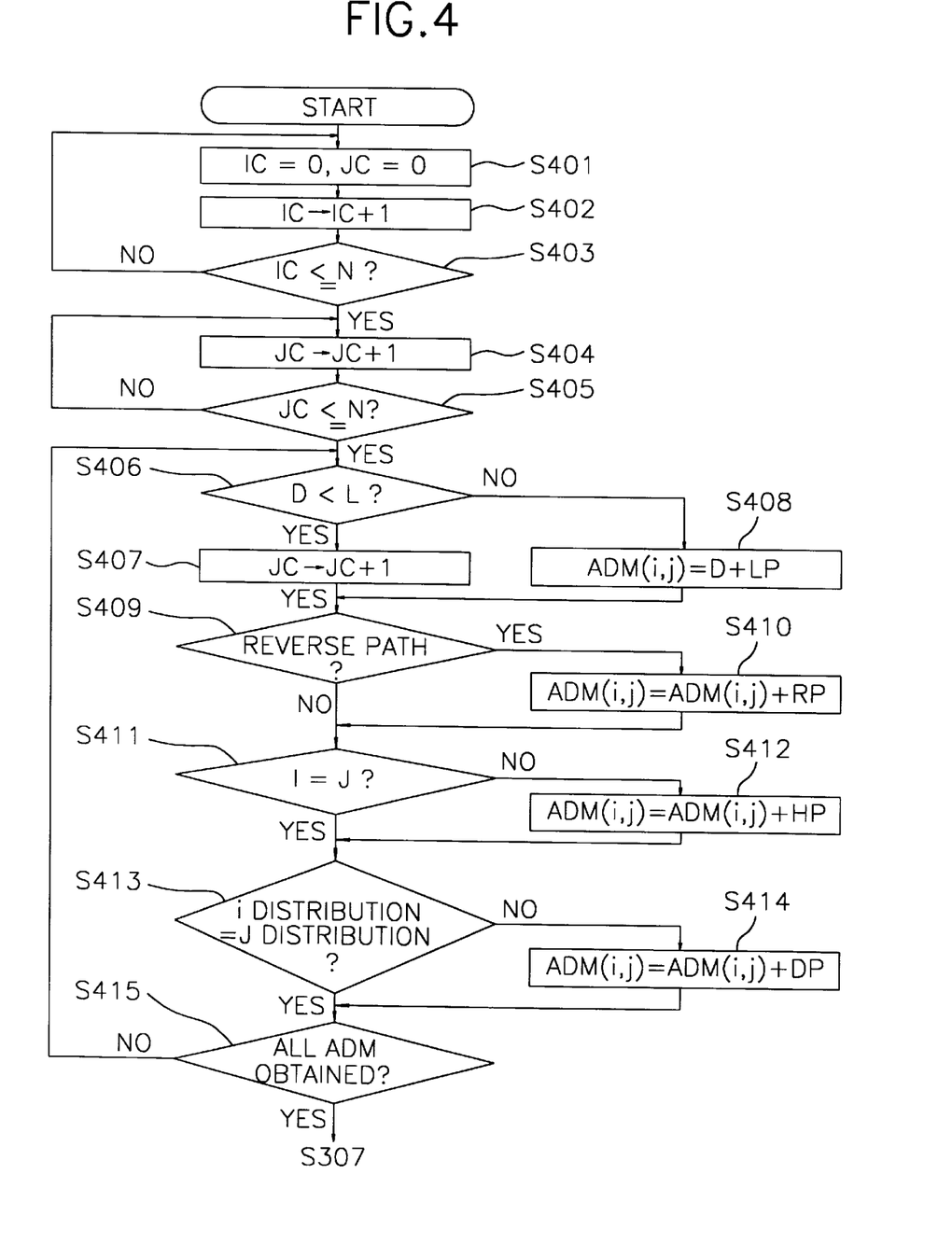
FIG. 4 is a flow chart for illustrating a method of producing the adjacent distance matrix of FIG. 3.

In step S308, the controller 122 produces the automatic inserting path based on the ADM(i,j) obtained in step S307. An operation of the method for producing the ADM(i,j) of step S306 in FIG. 3 will be described with reference to FIG. 4. FIG. 4 illustrates a method of producing the ADM(i,j) of FIG. 3.

In step S401, the controller 122 sets a count value IC of an optional row component index "i" and a count value JC of an optional column component index "j" to "0".

In step S402, the controller 122 adds "1" to the count value IC of the optional row component index "i".

In step S403, the controller 122 judges whether or not the count value IC of the optional row component index "i" is smaller than or equal to a total number N of the electronic components to be inserted into the printed circuit board.

As a result of the judgement in step S403, when the count value IC of the optional row component index "i" is greater than the total number N of the electronic components to be inserted into the printed circuit board, the routine returns to step S401. On the contrary, when it is judged that the count value IC of the optional row component index "i" is smaller than or equal to the total number N of the electronic components to be inserted into the printed circuit board, the controller 122 adds "1" to the count value JC of the optional column component index "j" (step S404).

In step S405, the controller 122 judges whether or not the count value JC of the optional column component index "j" is smaller than or equal to a total number N of the electronic components to be inserted into the printed circuit board.

As a result of the judgement in step S405, when the present count value JC of the optional column component index "j" is greater than the total number N of the electronic components to be inserted into the printed circuit board, the routine returns to step S404. On the contrary, when it is judged that the present count value JC of the optional column component index "j" is smaller than or equal to the total number N of the electronic components to be inserted into the printed circuit board, the controller 122 decides whether or not a distance D between i and j components is less than the limit distance L which is stored in the memory 110(step S406).

As the result of the decision in step S406, when the distance D between i and j components is less than the limit distance L, the controller 122 sets ADM(i,j) =the distance D between i and j components (step S407). On the contrary, when the distance D between i and j components is equal to or greater than the limit distance L, the controller 122 sets ADM(i,j)=the distance D between i and j components +limit distance penalty LP (step S408).

After steps S407 or S408 have been carried out, the controller 122 decides whether or not an i-j path is a reverse path(step S409). As the result of the decision in step S409, when the i-j path is the reverse path, the controller 122 sets ADM(i,j) =ADM(i,j) +a reverse path penalty RP (step S410). After performing step S410 or when the i-j path is a forward path in step S409, the controller 122 decides whether or not an inserting head number J of the j component is equal to an inserting head number I of the i component(step S411).

As the result of the decision in step S411, when the inserting head number J of the j component is different from the inserting head number I of the i component, the controller 122 sets ADM(i,j) =ADM(i,j) +head order penalty HP (step S412).

After performing step S412 or when it is judged that the inserting head number J of the j component is equal to the inserting head number I of the i component, the controller 122 decides whether or not a distribution area of the j component is equal to a distribution area of the i component (step S413).

As the result of the decision in step S413, when the distribution area of the j component is different from the distribution area of the i component, the controller 122 sets ADM(i,j) =ADM(i,j) +distribution penalty DP (step S414).

After performing step S414 or when the distribution area of the j component is equal to the distribution area of the i component, the controller 122 decides whether or not the ADM with respect to all i and j components is obtained (step S415).

As the result of the decision in step S415, when the ADM(i,j) with respect to all i and j components is not obtained, the routine returns to step S406. On the contrary, when the ADM(i,j) with respect to all i and j components is obtained, the routine goes to step S307 of FIG. 3.

Figure 5:
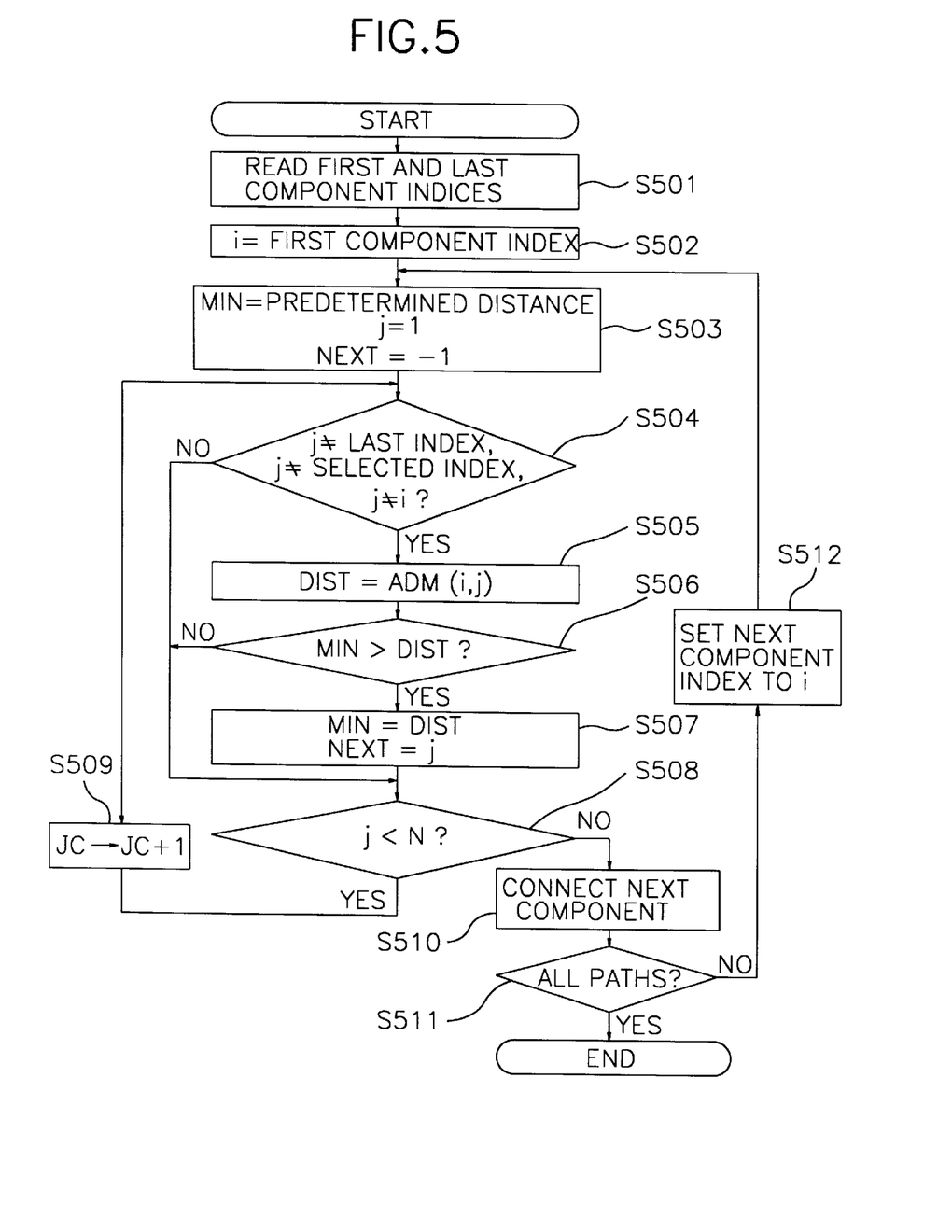
FIG. 5 is a flow chart for illustrating a method of producing the automatic inserting path of FIG. 3.

Operation for producing the automatic inserting path of step S308 in FIG. 3 will now be described with reference to FIG. 5. FIG. 5 is a flow chart for illustrating a method of producing the automatic inserting path of FIG. 3.

In step S501, the controller 122 reads indices of the first and last components selected in step S305 or step S306 from the ADM(i,j) obtained in step S307.

In step S502, the controller 122 sets an optional row component index "i" as the first component index.

In step S503, the controller 122 sets a reference distance MIN to a predetermined distance, sets an optional column index "j" to "1", and sets a next inserting component to "−1". In an embodiment of the present invention, preferably, the reference distance MIN is set to a distance greater than the greatest distance among distances between two electronic components.

In step S504, the controller 122 judges whether the optional column index "j" is different from the last component index, a component index that is already selected in the automatic path, and the optional row index "i".

As a result of the judgement in step S504, when the optional column index "j" is different from the last component index, the already selected index in the automatic path, and the optional row index "j", the controller 122 sets a distance DIST between two selected components as the ADM(i,j) (step S505).

In step S506, the controller 122 judges whether or not the reference distance MIN set in step S503 is equal to or greater than the distance DIST between two selected components.

As a result of the judgement in step S506, when the set reference distance MIN is equal to or greater than the distance DIST between two selected components, the controller 122 sets the set reference distance MIN as the distance DIST between two selected components and sets a component corresponding to the optional column component index "j" as a next inserting component(step S507).

When it is judged that the optional column index "j" is equal to the last component index, the index that is already selected in the automatic path, or the optional row index "i" in step S504, when it is judged that the set reference distance MIN is smaller than the distance DIST between two selected components in step S506, or after performing step S507, the controller 122 judges whether or not the optional column component index "j" is smaller than or equal to the total number N of components to be inserted into the printed circuit board(step S508).

As a result of the judgement in step S508, when the count value JC of the optional column component index "j" is smaller than the total number N of components, the controller 122 adds "1" to the count value JC of the optional column component index "j" (step S509) and the routine returns to step S504. On the contrary, when it is judged that the count value JC of the optional column component index "j" is equal to or greater than the total number N of components in step S508, the controller 122 connects the next inserting component next to the first component corresponding to the first component index "i" set in step S502 in the automatic inserting path.

In step S511, the controller 122 judges whether or not all paths of the automatic inserting path are constituted.

As a result of the judgement in the step S511, when all the paths of the automatic inserting path are constituted, a total operation finishes. On the contrary, when at least one path of the automatic inserting path is not connected, the controller 122 sets an index of the next inserting component as the optional row index "i" (step 512), and the routine executes step S503.

As mentioned above, in accordance with the present invention, an automatic inserting path of an automatic insertion apparatus is automatically produced so that a starting and ending point of each equipment is selected by a worker or selected automatically.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A method for producing an automatic inserting path in an apparatus for automatically inserting electronic components into a printed circuit board comprising the steps of:

(i) storing automatic inserting path data and a limit distance between two electronic components to he inserted into the printed circuit board, wherein the automatic inserting path data includes computer aided design data of the printed circuit board and component data, the computer aided design data including component number data of all electronic components to be inserted into the printed circuit board, and x and y coordinates of the printed circuit board, and the component data including cormponent number data of all the electronic components corresponding to the component number data of the computer aided design data, codes of all the electronic components, and component name standards;

(ii) displaying the printed circuit board in which all the electronic components are inserted on a screen;

(iii) selecting the first and last components from all the electronic components of the printed circuit board displayed in step (ii), wherein the first and last components represent starting and ending components of the automatic inserting path, respectively;

(iv) producing an adjacent distance matrix (ADM) (i, j), the ADM(i,j) being a matrix that forms distances between i and j components to be inserted into the printed circuit board in a form of a matrix where i and j represent optional row and column component indices, respectively, wherein step (iv) includes (iv-1) setting count values of optional row and column component indices to zero, (iv-2) adding one to the count values of the optional row component index, (iv-3) judging whether the count value of the optional row component index of step (iv-2) is smaller than or equal to a total number of the electronic components to be inserted into the printed circuit board, (iv-4) adding one to the count value of the optional column component index when the count value of the optional row component index is smaller than or equal to the total number of the electronic components to be inserted into the printed circuit board, (iv-5) judging whether the count value of the optional column component index of step (iv-4) is smaller than or equal to the total number of the electronic components to be inserted into the printed circuit board, (iv-6) comparing a distance between i and j components with the limit distance stored in step (i) when the count value of the optional column component index is smaller than or equal to the total number of the electronic components in order to decide whether the ADM(i,j) is set to the distance between i and j components, (iv-7) firstly deciding whether an i-j path is a revere path and controlling addition of a reverse path penalty to the ADM(i,j) according to the first decision, (iv-8) secondly deciding whether an inserting head number of the j component is equal to an inserting head number of the i component and controlling addition of a head order penalty to the ADM(i,j) according to the second decision, (iv-9) thirdly deciding whether a distribution area of the j component is equal to a distribution area of the i component and controlling addition of a distribution penalty to the ADM(i,j) according to the third decision, and (iv-10) fourthly deciding whether the ADM(i,j) with respect to all i and j components is calculated and controlling whether the calculation of the ADM(i,j) is stopped according to the fourth decision;

(v) producing an automatic inserting path based on the the ADM(i,j) obtained in step (iv), wherein step (v) includes (v-1) reading indices of the first and last components selected in step (iii) from the ADM(i,j) obtained in step (iv), (v-2) setting an optional row component index as the first component index, (v-3) setting a reference distance, an optional column component index, and a next inserting component to a predetermined number, one, and −1, respectively, (v-4) judging whether the optional column component index is different from the last component index, a component index that is already selected in the automatic path, and the optional row component index, (v-5) setting a distance between two selected component as the ADM (i,j) when the optional column component index is different from the last component index, the already selected index in the automatic path, and the optional row component index, (v-6) judging whether the reference distance set in step (v-3) is greater than the distance between two selected components, (v-7) setting the reference distance to the distance between two selected components and setting a component corresponding to the optional column component index as a next inserting component when the set reference distance is equal to or greater than the distance between two selected components, (v-8) judging whether the optional column component index is smaller than or equal to the total number of components to be inserted into the printed circuit board, (v-9) adding one to the count value of the optional column component index and executing step (v-4) when the count value of the optional column component index is smaller than the total number of electronic components, and connecting the next inserting component to the first component corresponding to the first component index set in step (v-2) in the automatic inserting path when the count value of the optional column component index is equal to or greater than the total number of electronic components, (v-10) judging whether all paths of the automatic inserting path are constituted, (v-11) finishing a total operation when all the paths of the automatic inserting path are constituted, and setting an index of the next inserting component as the optional row component index and executing step (v-3) when at least one path of the automatic inserting path is unconnected.

2. The method in accordance with claim 1, wherein step (v-8) is executed when the optional column component index is equal to at least one of the last component index, the index already selected in the automatic path, and the optional row component index in step (v-4).

3. The method in accordance with claim 1, wherein step (v-8) is executed when the set reference distance is smaller than or equal to the distance between two selected components in step (v-6).

4. The method in accordance with claim 1, wherein step (iv-6) includes (iv-6-1) deciding whether the distance between i and j components is less than the limit distance; and (iv-6-2) setting ADM(i,j) to the i-j distance when the distance between i and j components is less than the limit distance, and setting the ADM(i,j) to ADM(i,j)+i-j distance +limit distance penalty when the distance between i and j components is equal to or greater than the limit distance.

5. The method in accordance with claim 1, wherein going to step (iv-8) when the i-j path is a forward path, and setting the ADM(i,j) to ADM(i,j)+a reverse path penalty and going to step (iv-8) when the i-j path is the reverse path, in step (iv-7).

6. The method in accordance with claim 1, wherein going to step (iv-9) when the inserting head number of the j component is equal to the inserting head number of the i component, and setting the ADM(i,j) to ADM(i,j)+head order penalty and going to step (iv-9) when the inserting head number of the j component is different from the inserting head number of the i component, in step (iv-8).

7. The method in accordance with claim 1, wherein going to step (iv-10) when the distribution position of the i component is equal to the distribution position of the j component, and setting the ADM(i,j) to ADM(i,j)+ distribution penalty and going to step (iv-10) when the distribution position of the i component is different from the distribution position of the j component, in step (iv9).

8. The method in accordance with claim 1, wherein going to step (v) when the ADM(i,j) of all the i and j components is calculated, and returning to step (iv-6) when the ADM(i,j) of all the i and j components is not calculated, in step (iv-10).

* * * * *